United States Patent [19]

Olson

[11] Patent Number: 4,815,594
[45] Date of Patent: Mar. 28, 1989

[54] UNIVERSAL PACKAGING SYSTEM FOR ELECTRICAL COMPONENTS AND THE LIKE

[75] Inventor: Thorwald F. Olson, Wheaton, Ill.

[73] Assignee: Molex Incorporated, Lisle, Ill.

[21] Appl. No.: 123,004

[22] Filed: Nov. 19, 1987

Related U.S. Application Data

[63] Continuation-in-part of Ser. No. 44,386, Apr. 30, 1987.

[51] Int. Cl.[4] .................. B65D 85/42; B65D 65/18
[52] U.S. Cl. .................................... 206/328; 206/334;
206/331; 361/212; 361/220
[58] Field of Search .................. 206/328, 331, 334;
361/212, 220

[56] References Cited

U.S. PATENT DOCUMENTS

| | | | |
|---|---|---|---|
| 4,138,835 | 2/1979 | Takayanagi et al. | 53/474 |
| 4,355,719 | 10/1982 | Hinds et al. | 206/334 |
| 4,465,206 | 8/1984 | Sorel et al. | 221/4 |
| 4,487,315 | 12/1984 | Azuma | 206/334 |
| 4,488,662 | 12/1984 | Fanning | 221/197 |
| 4,565,288 | 1/1986 | Walther | 206/334 |
| 4,590,534 | 5/1986 | Akamatsu et al. | 206/328 |
| 4,592,481 | 6/1986 | Chen | 206/328 |
| 4,598,820 | 7/1986 | Murphy | 206/328 |
| 4,662,514 | 5/1987 | Berbeco | 206/328 |
| 4,711,350 | 12/1987 | Yen | 206/328 |

FOREIGN PATENT DOCUMENTS

| | | |
|---|---|---|
| 60-117799 | 6/1985 | Japan . |
| 60-137734 | 7/1985 | Japan . |
| 60-167400 | 8/1985 | Japan . |
| 60-167499 | 8/1985 | Japan . |
| 60-169197 | 9/1985 | Japan . |
| 8606049 | 10/1986 | PCT Int'l Appl. . |
| 2127380 | 4/1984 | United Kingdom . |

*Primary Examiner*—Joseph Man-Fu Moy
*Attorney, Agent, or Firm*—John W. Cornell; Louis A. Hecht

[57] ABSTRACT

A universal packaging system for objects such as electrical components, connectors, semiconductors, chips, etc. includes an elongated, hollow, tubular package formed of resiliently deformable material for containing a plurality of said objects, each object having an identical or substantially similar silhouette or profile and orientated with a predetermined axis of its profile, aligned along a common longitudinal axis or line within the tube. The tubular package includes a unitary, continuous wall of flexible material defining an elongated object receiving space having a first cross-sectional shape intermediate its opposite ends that is shaped and dimensioned for holding a plurality of the objects in said line along said common axis and maintaining each object in substantially the same orientation while permitting free longitudinal movement along the line within the tube. At least one end portion of the tube is formed with a second cross-sectional shape to act as stop or valve at the end of the package for limiting the entry or exit of objects into or out of the tube. The second cross-sectional shape at the end portion is deformable by external force into a third cross-sectional shape that is then capable of passing the silhouette of the objects without substantial interference for loading and dispensing objects into and out of the tube. Subsequently, when the external force is relaxed, the resilient wall returns back to the second cross-sectional shape and acts as a closed valve to block the entry or exit of objects into or out of the package. After a plurality of objects are inserted longitudinally into the tubular package while an end portion is in a deformed condition, the external force is removed, and a row of objects is then maintained in place within the tubular package as the end portion of the unitary wall returns to the undeformed second cross-sectional shape. A package is thereby formed providing protection for the connectors during storage, handling, and shipment, and the tubular housing also serves as a feed magazine for dispensing the objects at an assembly station or other work station as needed. The present invention also features an apparatus and method for loading packages of connectors and for unloading or feeding connectors from the packages at a point of end usage.

14 Claims, 4 Drawing Sheets

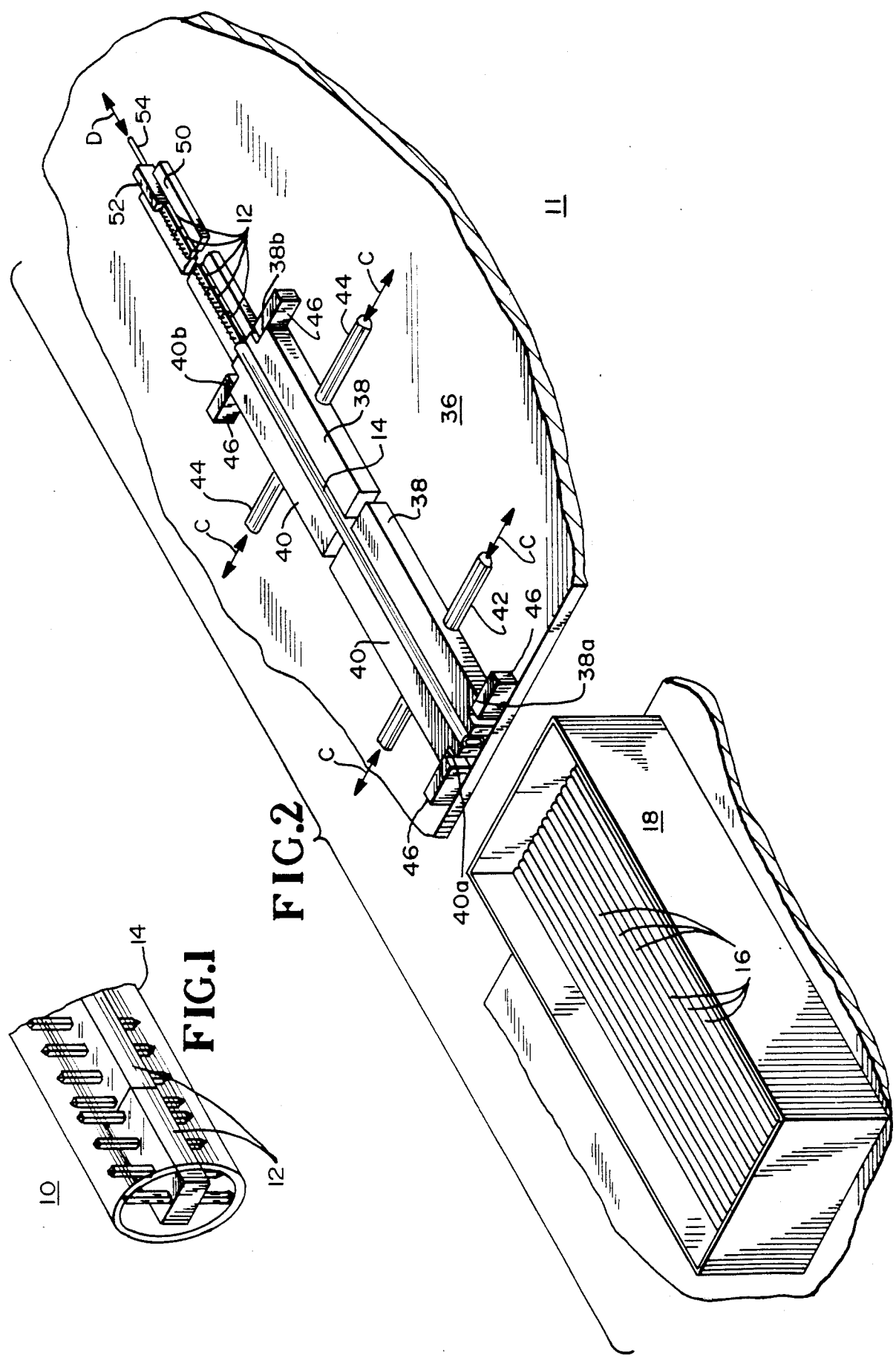

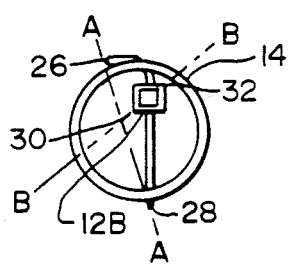
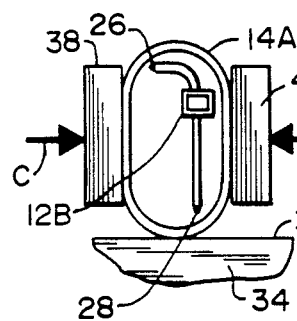
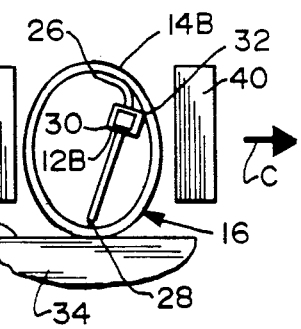
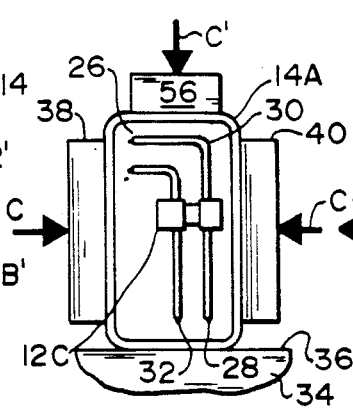
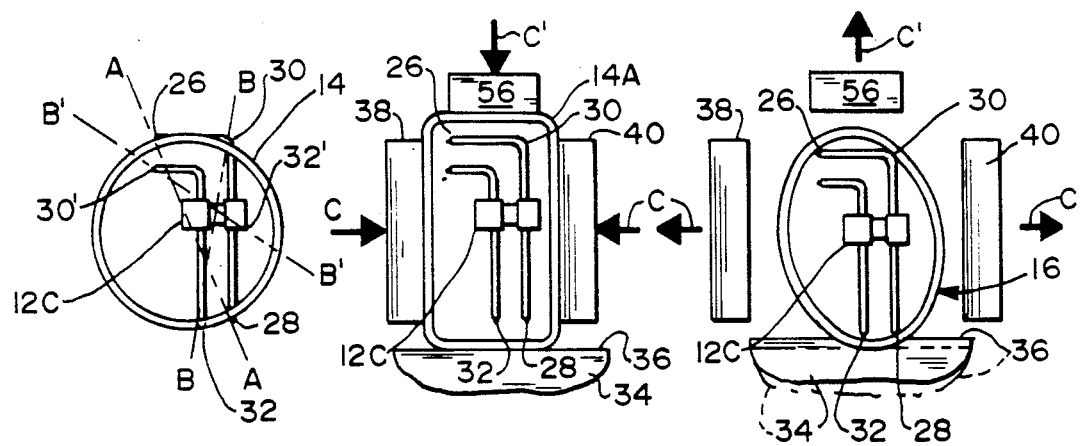
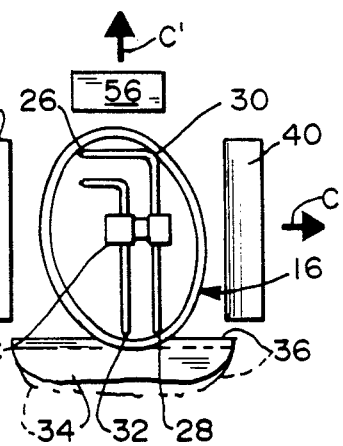
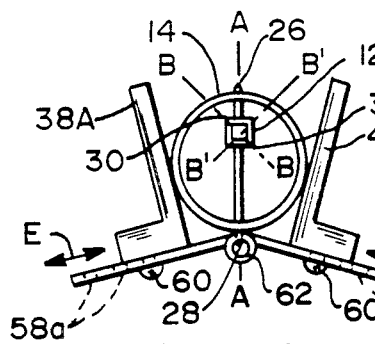
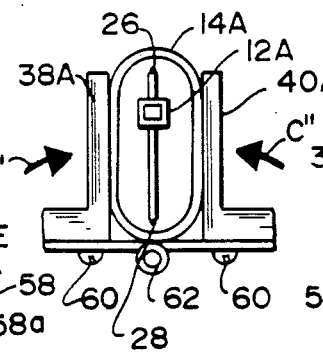
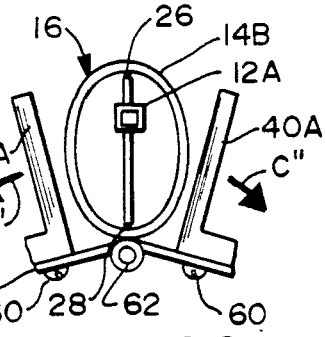
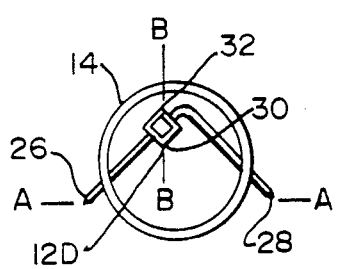
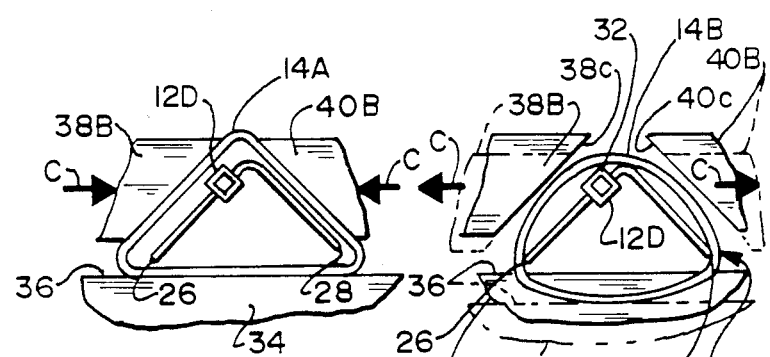
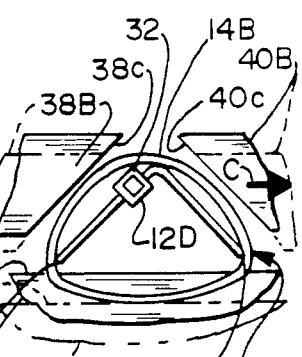

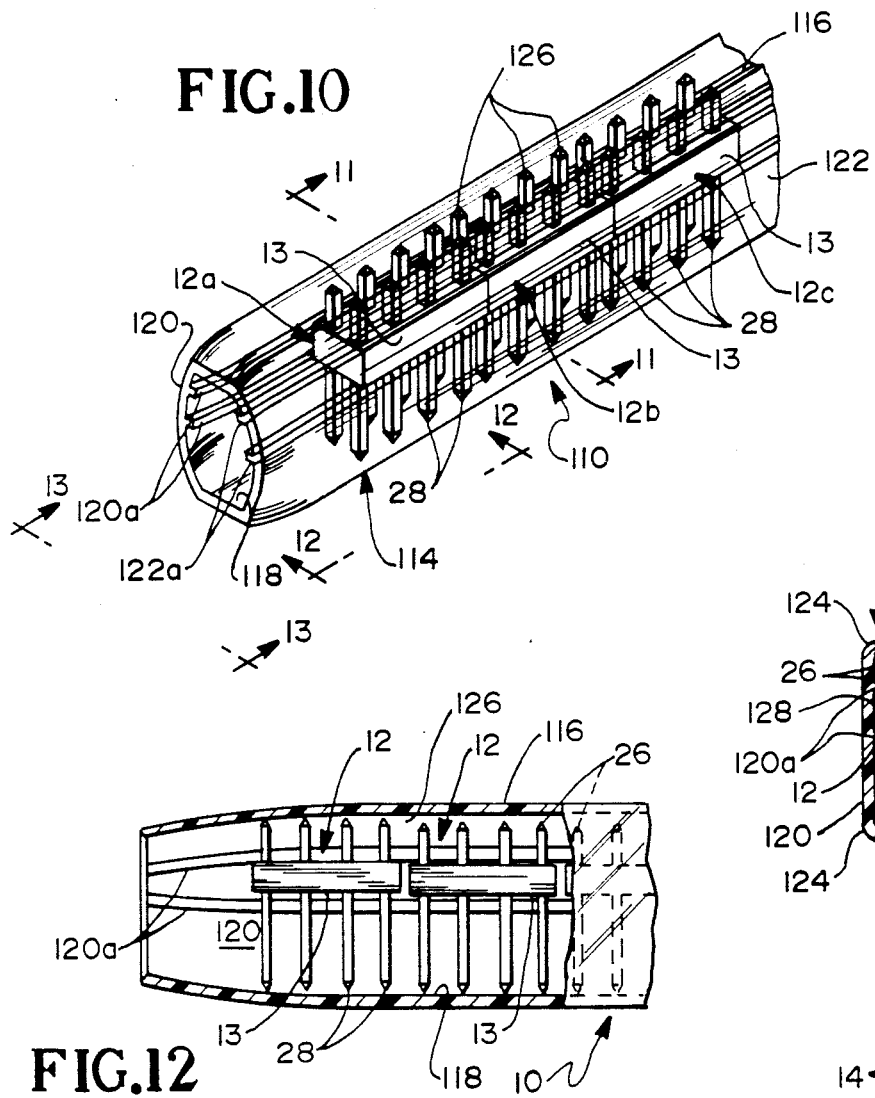
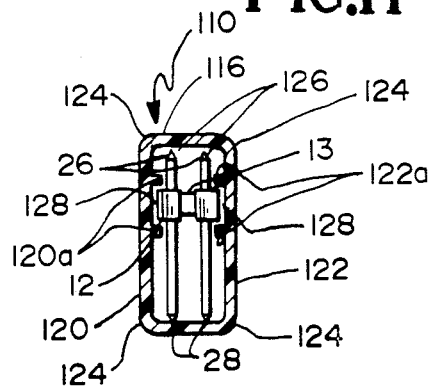
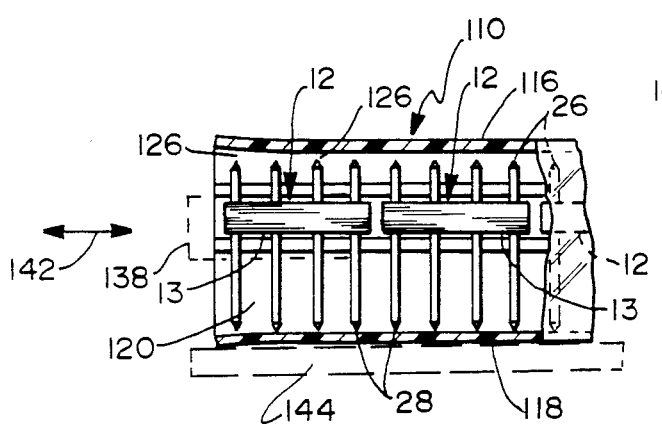
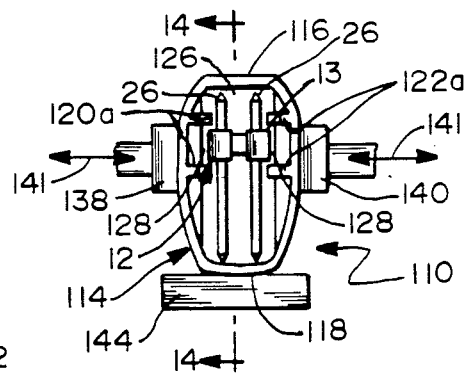

UNIVERSAL PACKAGING SYSTEM FOR ELECTRICAL COMPONENTS AND THE LIKE

RELATED APPLICATION

This application is a continuation-in-part of copending U.S. patent application Ser. No. 44,386, filed Apr. 30, 1987, and assigned to the same assignee as this application.

BACKGROUND OF THE INVENTION

1. Field of the Invention

The present invention relates to a new and improved universal package for containing a plurality of objects such as electrical components, connectors, chips, semiconductors, etc. having similar profiles or silhouettes and the invention also relates to a new and improved apparatus and method for loading said packages and for feeding or dispensing the objects from the packages at a remote work station or point of assembly.

2. Brief Description of the Prior Art

An ever-increasing need is present for a universal packaging system for objects such as electrical connectors and the like, which may vary widely in size and in shape or profile. Often electrical components such as connectors are produced at one location and then must be packaged or stored and thereafter transported in a safe and efficient manner to a remote location where the individual components are utilized in the fabrication of more complex electronic and electrical devices. Because such electrical components are produced in almost an endless variety of different shapes and sizes, it is extremely desirable to provide a universal packaging system which is capable of handling the infinitely diverse types of components with a minimal effort and expenditure for tooling and packaging costs.

U.S. Pat. No. 4,138,835 discloses a method and apparatus for preparing a cassette loaded with a plurality of relatively small size electronic parts for use in the electronic industry. U.S. Pat. No. 4,355,719 discloses a shock and impact resistant ceramic semiconductor package. U.S. Pat. No. 4,465,206 discloses a device for the simultaneous mounting of electrical components on a common carrier. U.S. Pat. No. 4,487,315 discloses a tube assembly for integrated circuit components slidably mounted on an elongated rail. U.S. Pat. No. 4,488,662 discloses a magazine for use in automatic, electrical component assembling devices wherein means is provided for advancing electrical components out of a magazine feed path for sequential pick-off.

International Patent Publication No. WO86/06049, published Oct. 23, 1986 discloses an elongated electrically conductive polymeric tube for storing, transportation and handling of static sensitive semiconductor microchips or other static sensitive electronic devices.

British patent No. 2 127 380, dated Sept. 17, 1986, discloses an opaque, anti-static packaging tube for encapsulated integrated circuit components having a see-through window extending along the length of the tube arranged so that the circuit components do not touch the window but permit the circuit components contained in the tube to be viewed from the outside.

Japanese patent publication No. J-60117799, published June 25, 1985, discloses a magazine for housing dual in-line semiconductor devices with a projected package guide device extending in a longitudinal direction. Japanese patent publication No. J-60137734 published July 22, 1985, discloses a magazine connecting device for an integrated circuit unloader having space for monitoring a joint portion of a projected magazine and a pick-up or shooting element. Japanese patent publication No. J60167400 published Aug. 30, 1985, discloses a semiconductor element supply component for providing a long time continuing operation by using a plurality of stacked magazines. Japanese patent publication No. J-60167499 published Aug. 30, 1985, discloses a magazine for semiconductor devices having a cylindrical main casing and at least one cylindrical casing end formed to be opened and closed freely and Japanese patent publication No. 60169197 published Sept. 23, 1985, discloses a part container having a concave cross-section with a stopper at one end to contain integrated circuit sockets, etc.

Most, if not all, of the magazines, packages or containers disclosed in the aforementioned prior art patents and publications have relatively complex cross-sectional shapes with diverse reentrant portions. Reentrant portions are defined as any protuberances such as walls, ribs, flanges and the like that extend or project inwardly into the transverse cross-sectional area generally defined by the outer tubular wall of a hollow shape. Many packages are formed of relatively rigid material such as polyvinylchloride and having a cross-sectional shape that is specifically designed to accommodate only a single shape of component. A problem that occurs with rigid tubular packages is that during use or handling, bending stresses may be applied resulting in kinking or a permanent bend or break in the package wall rendering the package unsuitable for further use, especially when the package is to be unloaded while serving as a magazine or dispenser of the objects contained therein.

Moreover, none of the containers, magazines or packages appear to suggest that a package be constructed with a universal transverse cross-sectional shape of circular or oval configuration wherein outer protuberances or extremities of the components contained therein are frictionally engaged with internal wall surfaces and wherein a universal circular shaped tube can be utilized for packaging a plurality of widely differently shaped objects. Most of the prior art packages or magazines provide for free, sliding movement of the components in the packages and some of the packages or magazines require removable end plugs or stops in order to keep the components from sliding out, especially during storage, transport, and handling before finally reaching a point of end use or installation.

OBJECTS OF THE PRESENT INVENTION

It is an object of the present invention to provide a new and improved universal packaging system for objects such as electrical components, connectors, switches, printed circuit elements, semiconductors, etc. and more particularly to provide a new and improved universal packaging system wherein an elongated tubular container having a flexible wall of generally circular cross-section is utilized for packaging a wide range of differently shaped objects having an almost infinite variety of different profiles, silhouettes and sizes.

Another object of the present invention is to provide a new and improved universal package of the character described which is formed of flexible, rather than rigid material and which requires no complex cross-sectional shapes of a specialized nature.

Another object of the present invention is to provide a new and improved universal package of the character described which does not require end walls or end plugs in order to maintain a plurality of objects within the package.

Another object of the present invention is to provide a new and improved universal package of the character described which does not require holes or slots to be punched in the package wall for securing end plugs and the like.

Another object of the present invention is to provide a new and improved elongated tubular package for holding a plurality of aligned and similarly oriented objects wherein the ends of the tubular package itself are permanently deformed to a shape different than the body of the package between the ends so that the deformed ends normally retain the objects within the package.

Another object of the present invention is to provide a new and improved tubular package of the character described in the foregoing object wherein the deformed ends are deflectable to provide a valve for permitting entry and exit of said objects to and from said package.

Another object of the present invention is to provide a new and improved tubular package of the character described in the foregoing object wherein inward pressure applied to opposite wall portions of said deformed ends is effective to open the valve and release of the inward pressure permits the valve to return to a closed position.

Another object of the present invention is to provide a new and improved apparatus and method for loading the new universal packages of the character described and for feeding or dispensing components therefrom while maintained in a selected orientation.

Another important object of the present invention is to provide a new and improved universal package of the character described wherein a resilient flexible tube of a given size can be utilized for holding articles of several different shapes and sizes.

Still another object of the present invention is to provide a new and improved hollow, tubular, flexible package for a plurality of electrical components which provides protection for the components during storage, shipment and handling, and which prevents misalignment or disorientation of the components within the package.

Another object of the present invention is to provide a package that also serves as a magazine or container for feeding or dispensing the components as desired in a selected orientation at a work station or point of assembly.

Yet another object of the present invention is to provide a new and improved universal package of the character described which precipitously reduces tooling and engineering costs and which is a great deal less expensive to make and use than prior art packages.

It is an object of the present invention to provide a new and improved packaging arrangement and method for handling a variety of small shaped articles such as electrical components and connectors, which is cheaper and easier to use and which may be readily incorporated into modern automated manufacturing operations.

Another object of the invention is to provide a package assembly which is easier and faster to load or fill with components and which is thereafter easier to unload.

Another object is to provide a low cost package which permits clear viewing of the components contained therein and the orientation thereof.

Another object of the present invention is to provide a new and improved apparatus and method for loading the new universal packages of the character described and for feeding or dispensing components therefrom while maintained in a elected orientation.

SUMMARY OF THE PRESENT INVENTION

The foregoing and other objects and advantages of the present invention are accomplished in a new and improved universal package for containing a plurality of objects such as electrical components, connectors, semiconductors, printed circuit components, and the like, and a new and improved apparatus and method for loading the packages initially and thereafter for feeding or dispensing the components from the packages at a remote location or point of end usage where the components are sequentially fed in a particular orientation to an assembly station or other operation.

The universal package of the present invention includes a new and improved elongated, hollow, tubular housing or carrier of generally square or rectangular cross-sectional shape having pairs of opposite wall portions formed of resilient, flexible or deformable material defining an elongated component receiving region. The wall has an elongated main body portion between opposite ends having an undeformed cross-sectional shape which is sized to slideably receive and hold a row of objects to be contained therein. At least one end portion of the wall is permanently deformed to a different cross-sectional shape by bending one pair of opposing wall portions outwardly away from the originally extruded shape thereby contracting toward one another a pair of opposing wall portions. These wall portions are spaced closer together forming an end valve for preventing the ingress or egress of components to or from the carrier body.

When an externally applied force is engaged with an end portion, the different or modified cross-sectional shape is changed temporarily to clear the particular profile or silhouette of the components without interference so that the components may be easily inserted into or dispensed from the package in a longitudinal direction to or from the open valve end portion of the tubular enclosure. When the external force is released, the end portion resiliently returns to the previous cross-sectional shape and acts as a closed valve to retain the objects within the carrier tube.

After a plurality of the objects are loaded into an elongated package tube, the external flexing force applied against the tube end is released or relaxed, and internal tension forces in the material of the tubular wall return the wall to its previous cross-sectional shape. As this occurs, the internal wall surface of the tube end moves into stopping engagement against at least one pair of opposite protuberances or extremities of an end component in the tube to thereby hold and retain all the components within the tube in a desired orientation and alignment in series along a common axial line within the package.

In a package unloading apparatus in accordance with the invention, an end of the universal packaging tube is squeezed between pressure members to change cross-sectional shape and release the objects contained therein so that the objects may be fed or dispensed from the open end in the desired orientation either one at a time or in a continuous flow. A cyclical application and release of squeezing force on the tube is effective to feed or dispense the objects from a packaging tube one at a time at a desired rate.

BRIEF DESCRIPTION OF THE DRAWINGS

FIG. 1 is a fragmentary, enlarged perspective view of a new and improved universal packaging tube of the present invention containing a plurality of aligned electrical connectors loaded therein;

FIG. 2 is a somewhat schematic and diagrammatic perspective view of the new and improved packaging tube of the present invention shown as it is being loaded with a plurality of small electrical components in a universal package loading apparatus in accordance with another aspect of the present invention and illustrating a carton containing a number of filled tubes for shipment or storage;

FIG. 6A is an enlarged transverse cross-sectional view of a tubular package shown in an unstressed or unflexed condition and superimposed on the profile or silhouette of another differently shaped connector that is to be inserted and contained therein;

FIG. 6B is a view similar to FIG. 6A but illustrating the tubular package with external force being applied to the package wall to alter the cross-sectional shape ready for receiving and for dispensing the differently shaped connectors to and from the package;

FIG. 6C is a view similar to FIGS. 6A and 6B, but illustrating a loaded package and showing the internal wall surface of the tube in frictional holding engagement with extremities or protuberances of the differently shaped connector contained therein;

FIG. 7A is an enlarged transverse cross-sectional view of a tubular package shown in an unstressed or unflexed condition and superimposed on the profile or silhouette of yet another differently shaped connector that is to be inserted and contained therein;

FIG. 7B is a view similar to FIG. 7A but illustrating the tubular package with external force being applied to the package wall to alter the cross-sectional shape ready for receiving and for dispensing the differently shaped connectors to and from the package;

FIG. 7C is a view similar to FIGS. 7A and 7B, but illustrating a loaded package and showing the internal wall surface of the tube in frictional holding engagement with extremities or protuberances of the differently shaped connectors contained therein;

FIG. 8A is an enlarged transverse cross-sectional view of a tubular package shown in an unstressed or unflexed condition and superimposed on the profile or silhouette of the connectors as shown in FIGS. 5A, B and C, that are to be inserted and contained therein;

FIG. 8B is a view similar to FIG. 8A but illustrating the tubular package with external force being applied to the package wall to alter the cross-sectional shape ready for receiving and for dispensing the connectors to and from the package;

FIG. 8C is a view similar to FIGS. 8A and 8B, but illustrating a loaded package and showing the internal wall surface of the tube in frictional holding engagement with extremities or protuberances of the connectors contained therein;

FIG. 9A is an enlarged transverse cross-sectional view of a tubular package shown in an unstressed or unflexed condition and superimposed on the profile or silhouette of yet still another differently shaped connector that is to be inserted and contained therein;

FIG. 9B is a view similar to FIG. 9A but illustrating the tubular package with external force being applied to the package wall to alter the cross-sectional shape ready for receiving and for dispensing the differently shaped connectors to and from the package;

FIG. 9C is a view similar to FIGS. 9A and 9B, but illustrating a loaded package and showing the internal wall surface of the tube in frictional holding engagement with extremities or protuberances of the differently shaped connectors contained therein;

FIG. 10 is a fragmentary, enlarged perspective view of a modified form of a new and improved universal packaging tube constructed in accordance with the features of the present invention for containing a plurality of aligned electrical connectors loaded therein;

FIG. 11 is a transverse cross-sectional view taken substantially along lines 11—11 of FIG. 10;

FIG. 12 is a side elevational view of an end portion of the universal packaging tube of FIG. 10 shown with an end portion cut away and in section;

FIG. 13 is an end elevational view of the universal packaging tube looking in the direction of arrows 13—13 of FIG. 10 but showing the end portion in a temporarily deformed condition for the entry and exit of connectors into and out of the interior of the tube; and FIG. 14 is a longitudinal cross-sectional view of the universal packaging tube taken substantially along lines 14—14 of FIG. 13.

DESCRIPTION OF PREFERRED EMBODIMENTS OF THE INVENTION

Figure 3:
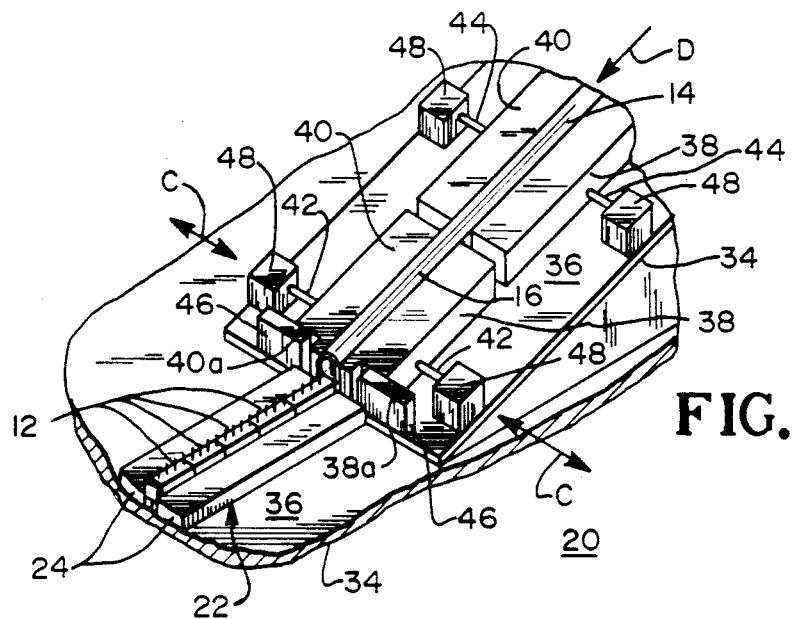
FIG. 3 is a fragmentary, somewhat schematic and diagrammatic perspective view of the new and improved packaging tube of the present invention as it is being unloaded in a new and improved apparatus for dispensing or feeding components from the universal packaging tube adjacent a work station in accordance with still another aspect of the present invention.

In reference to the drawings, in FIG. 1 is illustrated a new and improved packaging tube constructed in accordance with the features of the present invention and referred to by the reference number 10. The packaging tube 10 comprises an elongated, hollow, tubular body 14 of generally circular transverse cross-section formed of resilient, deformable, somewhat transparent plastic material and adapted to hold and contain a plurality of small objects such as electrical connectors 12 loaded into the tube in a selected orientation from an open end. The connectors 12 have identical or substantially similar profiles or silhouettes and at least one pair of opposite extremities or protuberances on each connector is frictionally held and engaged with the internal surface of the tube so that end plugs or stops are not required to keep the connectors in the open-ended package. Moreover, the frictional holding engagement between the extremities of the connectors and the internal tube wall surface maintains the connectors in a desired angular orientation within the surrounding and protective tube wall. Because the plastic material is resilient, deformable and transparent or semi-transparent, flexing of the tube can occur without kinking or permanent bending or breaking as with rigid packaging tubes and the connectors can be viewed while contained inside the tube to ascertain the type, orientation, etc., without disturbing the package.

Referring again more particularly to the drawings, in FIG. 2 is illustrated a new and improved package loading apparatus constructed in accordance with the features of the present invention and generally designated by the reference numeral 11. The apparatus 11 is especially adapted and designed to load a plurality of individual objects such as the electrical connectors 12 having identical or substantially similar profiles or silhouettes into the elongated, tubular housing or packaging tubes 14. Fully loaded packages 16 containing a relatively large number of the individual connectors 12 aligned in similar orientation in sequence along a longitudinal axis of the package are placed in a box or drawer 18 for storage or shipment to a remote package feeding or dispensing apparatus 20 at a different location, preferably closely adjacent to an end use work station 22 wherein the individual electrical connectors are dispensed or fed from the elongated tube 14 onto a guide rail system or way 24 while the selected orientation of the connectors is continuously maintained.

Figures 4A, 4B, 4C:
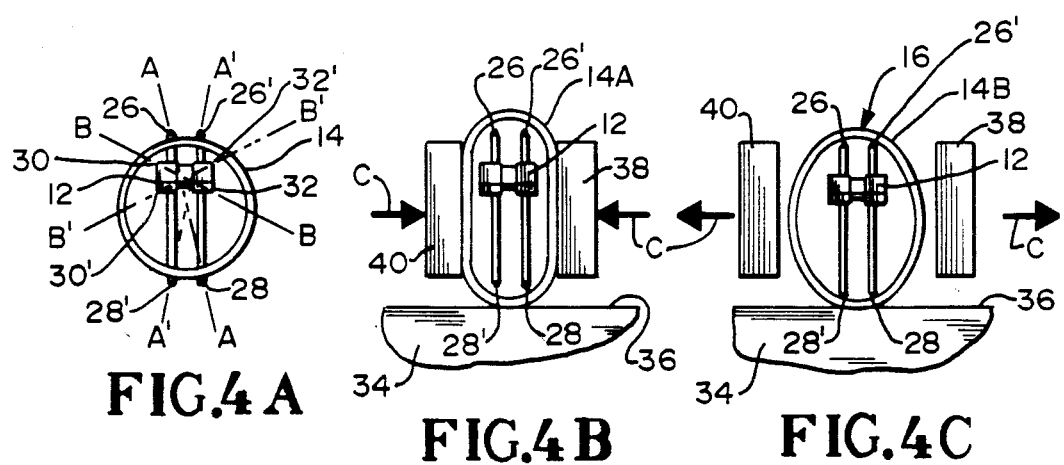
FIG. 4A is an enlarged transverse cross-sectional view of a tubular package shown in an unstressed or unflexed condition and superimposed on the profile or silhouette of a connector that is to be inserted and contained therein.
FIG. 4B is a view similar to FIG. 4A but illustrating the tubular package with external force being applied to the package wall to alter the cross-sectional shape ready for receiving and for dispensing the connectors to and from the package.
FIG. 4C is a view similar to FIGS. 4A and 4B, but illustrating a loaded package and showing the internal wall surface of the tube in frictional holding engagement with extremities or protuberances of the connectors contained therein.

In accordance with the present invention and as more particularly shown in FIGS. 4A, B, C-9A, B, C, loaded packages 16 containing a sequence or string of individual electrical connectors 12 or other objects aligned in a selected particular orientation are produced by providing an elongated hollow, cylindrical tubular housing or tube 14 having a generally circular transverse cross-section and formed of resilient flexible material, such as extruded polyethylene or polypropylene plastic resin. As illustrated in FIG. 4A, the circular hollow tube 14 has no internal reentrant portions such as walls or ribs and has a relatively smooth continuously curving, inner and outer surface of relatively constant radius curvature. A tube 14 having an initially circular cross-section is utilized in accordance with the invention to package and hold a wide variety of differently shaped objects such as electrical components comprising the connectors 12, or switches, relays, semiconductors, chips, etc. Moreover, a tube of given internal diameter may be used for several different types of connectors, each having a different shape, size or silhouette pattern.

Each connector 12 has a silhouette or profile as illustrated with a major dimension axis A—A of the profile extending between opposite outward extremities or protuberances at points 26 and 28. The measured distance or dimension between the points on the extremities is greater than the internal diameter of the hollow tube 14 while the tube is in an unstressed or undeflected condition and while the tube has a circular transverse cross-section as shown in FIG. 4A. Because of the difference in dimension between the smaller tube I.D. (internal diameter) and the major axis of the connector 12, it is not practical to directly insert the connectors 12 into the interior of the tube 14 from the ends. As shown in FIG. 4A, the orientation of the connector profile superimposed on the tube illustrates that interference occurs between the end portions of the extremities or protuberances of the connectors and the tube wall. These extremities on the connector profile usually comprise plugs, leads or pins which are often fragile and need to be protected during loading, handling and dispensing of the components from the package.

The specific connector 12, as shown in FIG. 4A has a profile defining a second major dimension axis axis A'—A', which axis angularly intersects the first major axis A—A, and forms a second set of outer extremities or protuberances 26' and 28' spaced apart by a distance substantially equal to the distance between protuberances 26 and 28, on major axis A—A. The tube 14 is sized so that the internal diameter is less than the distance between the points 26-28 or between the points 26'-28' on the major dimension axes while the tube is in an unstressed state or condition. It can also be seen that the particular connector 12 has a minor axis B—B angularly intersecting the major axes A—A and A'—A' at a point on a longitudinal axis of the tube. The axis B—B is drawn to extend through opposing extremities or points 30 and 32, which points are spaced apart by a distance that is considerably less than the distance between the points 26 and 28 or the points 26' and 28'. The shorter distance between the points 30 and 32 on the axis B—B is necessarily less than the internal diameter of the tube 14. Similarly, a second minor axis B'—B' can also be defined between points 30'-32' on the profile of the connector 12 and the axis B'—B' also angularly intersects the other axes A—A, A'—A' and B—B within the interior of the tube.

The connector 12 has a symmetrical profile and a plurality of outer protuberances or extremities that may be defined as lying on a pair of intersecting major dimension axes and a pair of shorter minor dimension axes.

In order that the individual connectors 12 with their profiles aligned as illustrated in FIG. 4A may be readily inserted into the interior of the hollow tube 14 by the apparatus 11, the apparatus is provided with a base plate 34 having an upper surface 36 for supporting discrete lengths of tubes that are placed in position between one or more pairs of elongated, external force applying pressure members 38 and 40. The pressure members are engageable against opposite wall portions of the tube and are movable transversely toward and away from the outer wall surface as indicated by the arrows C. Movement of the external force applying members 38 and 40 over the fixed tube supporting surface 36 is controlled by one or more pairs of coaxially aligned push-pull rods 42 and 44, spaced apart longitudinally of the pressure members and transverse thereto as illustrated.

The forward end pressure members are formed with notches 38a and 40a adjacent a forward or exit end of the apparatus 10 and similar notches 38b and 40b are provided adjacent the entrance or rearward end on the rearward end pressure members. The notches form shoulders which cooperate with pairs of stops 46 secured on the base 34 in order to limit the maximum amount of outward travel of the force applying members 38 and 40 away from one another. Controlled movement of the rods 42 and 44 is provided by individually controllable, double acting, fluid cylinders 48 or by push-pull type solenoids or mechanical equivalents in order to exert a desired amount of external compression force on a tubular element 14 placed between the members 38 and 40. The open spacing between the members 38 and 40 can also be varied as needed by the cylinders to provide accommodation for tubes having both relatively large and small diameters used for packaging components of different sizes, profiles and shapes.

Individual control of the respective pairs of cylinders 48 permits different amounts of squeezing action to be applied at different points along the length of a tube 14 when placed in position between opposed pairs of pressure member 38 and 40 in the apparatus 11 of FIG. 3 or an unloading feeder or dispenser apparatus 20 of FIG. 4. By only loosely squeezing the tube at one end, the tube can be closed against the entry or exit of connectors from the tube even though the tube remains open at the ends. Moreover, the cylinders 48 can be cyclically actuated to squeeze and release each pair of pressure members 38 and 40 in synchronism so that a valving action is provided for loading or unloading the connectors.

The new and improved package loading apparatus 11 as shown in FIG. 2 and the new and improved feeder or dispenser apparatus 20 shown in FIG. 3 are somewhat similar in construction and operation and identical reference numerals are utilized for similar or identical components thereof. The loading apparatus, 11 is designed to load into a package, a plurality of individual electronic components such as the connectors 12, previously having been aligned in a feed track 50 with their profiles arranged in similar orientation. The connectors are moved along toward a forward end of the feed track 45 which is in direct alignment with an entry end of an elongated tube 14 placed in a receiving position between the external force applying members 38 and 40. Because of interference between the tube wall profile and the profile of the connectors, before loading can commence the tube is compressed to form a second and different transverse cross-sectional shape as shown in FIG. 4B and indicated by reference numeral 14A, wherein opposite side portions of the tube wall are flattened out and moved toward one another by inward movement of the force applying members 38 and 40 as indicated by the arrows C. The initial circular transverse cross-sectional shape of the tube 14 is changed to a "racetrack" cross-sectional shape so that the outer extremities or protuberances and end points 26, 26', 28 and 28' of the connectors 12 no longer interfere with the surrounding tube wall and can freely slide into the tube without substantial frictional contact. A full load of connectors may be pushed into the interior of the tube 14A (FIG. 4B) by movement from the rail 50 in a longitudinal direction. This feeding movement may be accomplished by the force of gravity, by hand or with a reciprocating pusher element 52 and a push-pull rod 54 activated to move back and forth as indicated by the arrow D (FIG. 2) by means such as a fluid cylinder or push-pull solenoid (not shown) in a manner well known in the art.

The individual fluid cylinders 48 for reciprocally moving the forward push rods 42 and the rearward push rods 44 are individually selectively controlled so that the amount of lateral flexing action or compression of a tube 14 in a region adjacent the exit end may be different than the amount of compression in a region near the inlet end. This permits a connector 12 approaching the exit end of the tube to frictionally engage the internal wall surface of the flexed tube 14A just enough so that the connector will not continue to move and drop out of the open tube end. The connectors can be loaded into the entire length of a tube without the need for a stop plate at the end of the tube during the loading process.

After a tube is fully loaded with connectors by the apparatus 10, the squeezing force applied by the elongated members 38 and 40 is relaxed, and as the members 38 and 40 move away from one another (as shown in FIG. 4C by arrows C), the tube cross-section begins to return or resiliently spring back towards the original unflexed, circular shape as shown in FIG. 4A. However, the tube wall is prohibited from returning to a true circular cross-section by frictional engagement between the points 26, 26', 28, 28' of each connector with the internal wall surface of the tube. A filled tube package 16 thus has a somewhat oval shaped cross-section 14B (FIG. 4C), because of the contact between the connector extremities and the internal tube wall surface. When the tube is in the cross-sectional shape 14B, internal tension stress within the tube material causes a holding force to be applied to the connectors 12 at four different points (26, 26', 28 and 28') spaced around the periphery of the connector profile. The frictional contact at these points prevents the individual connectors from moving longitudinally in the tube and also prevents the connectors from rotating in the tube out of the desired orientation as shown. The completed, loaded packages 16 having a modified cross-sectional shape 14B are removed from the loading apparatus 10 and are usually placed in a drawer or box 18 for storage or shipment.

Referring to FIG. 3, when loaded packages 16 are received at the package feeding or dispenser apparatus 20, the tubes are placed in sequence between the elongated force applying members 38 and 40. The fluid cylinders 48 operating the push-pull rods 42 and 44 are selectively activated to squeeze the tubes 14B to form a cross-sectional shape 14A (FIG. 4B) so that the individual connectors 12 contained in the tube may then freely slide longitudinally out of the exit end of the package into an awaiting guide track 24 and without a substantial change in the angular orientation of the connector profile. The longitudinal sliding movement for feeding or dispensing the connectors 12 can be accomplished by the influence of gravity, by hand or by a selectively controllable force such as that exerted by a pusher element 52 and a pusher rod 54 controlled by a fluid cylinder or double acting solenoid mounted at a location adjacent the opposite or outer end of the packages 16 when in place as shown in FIG. 3. If desired, the exact amount of inward flexing action produced on opposite sides of a package 16 while situated between the members 38 and 40 can be cyclically controlled and adjusted to permit only one connector to feed out at a time, as the push-pull rods 42 are cycled back and forth a precise distance. This action provides an effective valve for controlling the feed rate of the connectors out of the tube. At the rearward or outer end of a package 16 in the apparatus 20, the control rods 42 may be moved inward initally and set to hold the tube open in the shape 14A in order to provide for free sliding movement of the connectors toward the rails 24 at the work station 22.

Except for an object having a truly circular profile, almost any shape of object or small electronic component can be packaged in a generally circular resilient, deformable tube 14 of the proper diameter and wall thickness and can be frictionally held in place in the tube in a desired angular orientation until dispensed or fed into a final assembly station. Any profile or silhouette can be said to have at least one major dimension axis A—A extended between two points on outer extremities of the profile and the distance between these points by definition is greater than the distance between two points on the extremities of the profile located on one or more minor dimension axes B—B or B'—B'. The major and minor axes of an object as defined must of necessity cross one another at an angle at an intersection point and the intersection point is located within the interior of the tube cross-section. The tube diameter is chosen for an object having a given profile so that the unstressed internal diameter of the tube 14 is less than the distance between the outer end points 26 and 28 on the major dimension axis A—A or points 26', 28' on the axis A'—A', but greater than the distance between the points 30, 32 or 30', 32' on the minor dimension axes B—B or B'—B'.

Figures 5A, 5B, 5C:
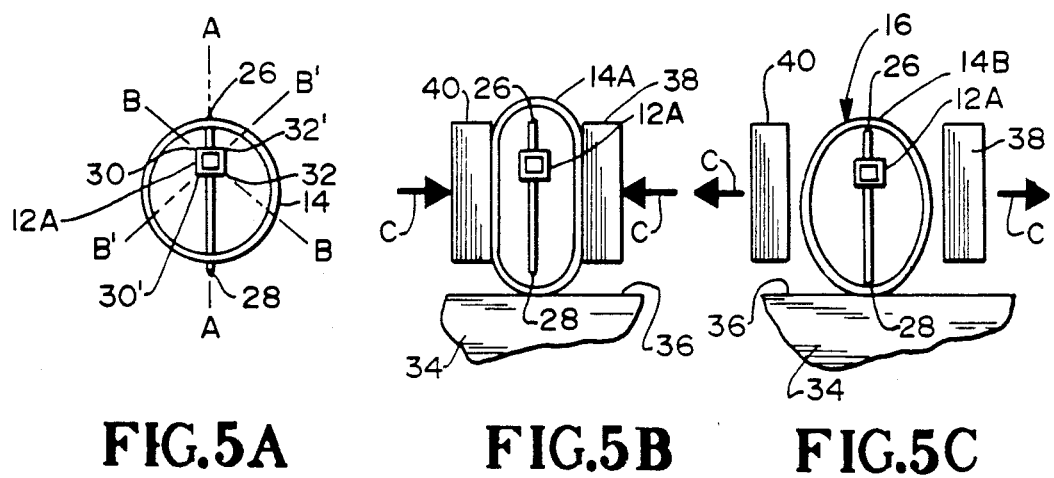
FIG. 5A is an enlarged transverse cross-sectional view of a tubular package shown in an unstressed or unflexed condition and superimposed on the profile or silhouette of a differently shaped connector that is to be inserted and contained therein.
FIG. 5B is a view similar to FIG. 5A but illustrating the tubular package with external force being applied to the package wall to alter the cross-sectional shape ready for receiving and for dispensing the differently shaped connectors to and from the package.
FIG. 5C is a view similar to FIGS. 5A and 5B, but illustrating a loaded package and showing the internal wall surface of the tube in frictional holding engagement with extremities or protuberances of the differently shaped connectors contained therein.

Referring now to FIGS. 5A, 5B and 5C, a modified form of connector or electrical component 12A having only a single major dimension axis A—A with outer end points on extremities or protuberances 26 and 28 is illustrated. The connector 12A has a silhouette or profile having a plurality of relatively short minor axes B—B or B'—B' and respective outer extremity points 30, 32 and 30', 32' at the ends. These points may never engage the internal wall surface of the tubular package 14, even after the connectors 12A are loaded into the tube 14B and the subsequent release of external force as indicated in FIG. 5C wherein the natural cross-sectional shape of the tube 14 tends to return from the oblong or racetrack configuration 14A (FIG. 5B) toward a circular shape. Only two outer end points 26 and 28 on the extremities of the profile of the connectors 12A are in frictional contact with the internal surface of the tube 14B. As shown in FIG. 5C, the somewhat oval shaped, transverse cross-sectional profile 14B tends to approach that of the tube shown in FIG. 4C, but is somewhat different because only two rather than four points of contact are formed between the connector 12A and the tube wall. It should be noted that when a loaded package 16 is subsequently squeezed (FIG. 4B) to form the cross-sectional shape 14A at an unloading station 20, the sharply curved lower portion of the tube itself provides a channel or guide trough which tends to provide self-centering action to preclude an orientation change of the connectors even though contact at upper points 26 and 26' is lost.

In the embodiment of FIGS. 4A, B, C, the connectors 12 are held by frictional contact at four separate points (26, 26', 28, 28') and the amount of frictional holding force is controlled by the internal diameter of the tube, the wall thickness of the tube, the type of material and the smoothness of the internal surface of the tube. In the embodiment of FIGS. 5A, B and C, the connectors 12A are held by frictional contact at only two points 26 and 28, but the holding force is still controlled by the same parameters.

Referring now to FIGS. 6A, B, C, therein is illustrated a package system for connectors 12B having a non-symmetrical profile rather than a symmetrical profile like the connectors 12 and 12A of FIGS. 4A, B, C and FIGS. 5A, B, C, respectively. As illustrated in FIG. 6A, the points 26 and 28 on the major dimension axis A—A are spaced apart by a distance greater than the internal diameter of the tube 14 in an undeflected state or condition. When opposite side portions of the tube are compressed or flattened as shown in FIG. 6B, the tube has a racetrack shaped transverse cross-section 14A which easily accommodates the asymmetrical profile of the connectors 12B during loading and dispensing. FIG. 6C represents the cross-sectional shape 14B assumed by the tube of a loaded package 16 when the force applying members 38 and 40 are moved away (arrows C) and the tube tends to return back to its original circular cross-section, but is prevented from doing so because of three points (26, 28 and 32) of frictional contact between the profile of each connector 12B and the internal wall surface of the tube 14B.

FIGS. 7A, B, C illustrate the packaging system of the present invention as utilized with connectors 12C having somewhat different, asymmetrical profiles or silhouettes. A modified form of loading apparatus 10 and dispensing apparatus 20 is utilized (as shown in FIGS. 7B and 7C) wherein, an additional, elongated external force applying pressure member 56 is provided opposite the fixed surface 36 of the base 34. When the connectors 12C are loaded into the tube or dispensed therefrom, the tube is squeezed in two directions at the same time and approaches a cross-sectional shape 14A having four flat sides with rounded corners. To produce the generally rectangular shaped transverse cross-section as illustrated in FIG. 7B, the pressure members 38 and 40 are moved toward one another (arrows C) to flatten out the tube to provide a pair of opposite vertical side portions and simultaneously, the additional pressure member 56 is moved downwardly (arrow C') toward the fixed surface 36 to flatten out an upper wall portion of the tube, intermediate or between the vertical sides. As this occurs, the tube is pressed bodily downward toward the flat surface 36 and a lower wall portion of the tube between the vertical side portions is also flattened out, thereby providing overall a generally rectangular cross-sectional shape 14A as shown.

As illustrated in FIG. 7B, the generally rectangular cross-sectional shape provides ample room for freely inserting or withdrawing connectors 12C into or out of the tube 14 while the tube is squeezed in two different transverse directions. After loading, the members 38 and 40 are moved away from one another and the member 56 is moved upwardly away from the surface 36 so that the deflection pressure on the tube is relaxed. The tube then tends to return to a true circular cross-sectional shape (FIG. 7A) but is prevented from doing so by frictional contact with points 26, 28, 30 and 32 on the extremities of the connector 12C and the loaded package 16 thus assumes the somewhat oval cross-sectional shape 14B as illustrated in FIG. 7C. Because the points of frictional contact are not equilaterally positioned around the periphery of the internal wall surface of the tube 14B, there may be some degree of rotation of the connectors 12C as a result. However, the rotational position change can be planned for and/or compensated for by changing the rotational orientation of the packages 16 when initially placed between the elongated pressure members at the unloading or dispensing apparatus 20 prior to squeezing the tube to alter the cross-section thereof.

Referring now to FIGS. 8A, B, C, therein is illustrated a modified form of loading apparatus 10 and feeding apparatus 20, wherein elongated external force applying pressure members 38A and 40A are pivotally interconnected together by a hinge 58 for relative pivotal movement to squeeze and release external force on a tube 14 as the upright pressure surfaces of the members are pivoted toward and away from each other as indicated by arrows C" in FIGS. 8B and 8C. The members 38A and 40A are made from angles and have lower or base flanges secured to the leaves of the hinge 58 by attachment screws 60. Each hinge leaf is provided with a plurality of apertures 58a (FIG. 8A) at different distances away from a pintle 62 of the hingle extending longitudinally along the tube 14, so that the tubes of different size can be accommodated. For example, with small size tubes, the screws 60 are inserted through the holes 58a that are closest to pintle 62 (arrow E) into threaded apertures provided in the lower legs of the pressure members 38A and 40B, whereas when larger size tubes are to be accommodated the screws 60 are inserted through apertures 58a farther away (arrows E) from the pintle.

As illustrated in FIG. 8B, when the hinge leaves are pivoted in opposite directions (arrows C") toward one another and the upright legs of the angle shaped pressure members 38A and 40A approach a vertical position, opposite wall portions of the tube 14 between the pressure members are flattened out to provide a racetrack shaped tube cross-section 14A ready to receive or dispense the connectors 12A or connectors of a different profile. Subsequently, after loading a package 16 of connectors, when the hinge leaves are pivoted in opposite directions (arrows C") away from one another (FIG. 8C) the pressure on the tube is relaxed or released and the tube naturally tends to assume a circular transverse cross-section but is prevented from doing so because of contact with the extremities of the connectors 12A at points 26 and 28. The tube then reaches an oval shaped cross-sectional shape 14B as illustrated in FIG. 8C and retains the connectors in place by frictional contact established by the interval tension forces in the tube wall.

In FIGS. 9A, B, C, is illustrated another connector 12D having yet another different and asymmetrical profile or silhouette that is somewhat triangular in shape. A pair of modified, elongated, force applying pressure members 38B and 40B are provided for the loading apparatus 10 and the feeding apparatus 20, each member having a tube engaging surface which is are sloped in an opposite direction away from the other and downwardly toward the fixed surface 36 of the base 34. When the members 38B and 40B are moved toward one another (arrow C) to squeeze the tube 14, the sloping surfaces bias the tube walls into a generally triangular-shaped transverse cross-section 14A having sharply rounded corners and a size ample to receive the connectors 12D inserted into an end of the tube in a longitudinal direction.

Upon a relaxation of the external force on the tube 14A by the outward movement of the members 38B and 40B (FIG. 9C), the tube tends to return to a circular shaped cross-section (FIG. 9A) but is prevented from doing so by contact at the points 26, 28 and 32 on the extremity of the profile of the connectors 12D. The end result is a cross-sectional shape 14B of a somewhat triangulated oval profile as illustrated in FIG. 9C.

From the foregoing, it will be appreciated that a new and unique universal packaging system in accordance with the invention is capable of handling a wide and diverse variety of objects having different shapes or profiles and different sizes. The package utilizes an elongate hollow tube of resilient flexible material having a generally circular transverse cross-section for all different shapes of objects. No intricate, complex tubular shapes are required, no holes or slots need be punched, and no end plugs or stops are needed because the unique packages in accordance with the invention hold the objects in place in the tube and retain the desired angular orientation thereof by means of frictional contact between the internal wall surface of the tube and at least two points on the extremities of the profile of each object contained. The packages serve to protect the objects contained therein during storage, shipment and handling but also serve as a magazine for feeding out the objects in sequence while maintaining the orientation thereof at an associated work station. Moreover, the loading and dispensing apparatus utilizing the unique packages is simple and foolproof in operation and tooling costs are held at a minimum.

The tubular packages of initially circular cross-section can be formed of transparent plastic material in an extrusion process out of relatively low-cost material such as polyethylene or polypropylene. This affords the opportunity to clearly view the package articles and the orientation thereof inside the loaded tube. Because only a single circular shape is required, tooling costs are minimal and dimensional tolerances on the I.D. and wall thickness are readily controlled. Moreover a tube of given internal diameter may be utilized for more than one different type or shape of object to be contained therein.

In comparison with the costs of prior art packages, the unique package of the present invention is much less costly, sometimes by an order of magnitude of one to seven or one to ten. For example, at present day prices, applicant has determined that a length of rigid PVC, contoured tubing with the necessary end stops may cost in the order of $0.23 to $0.30 per package, whereas a packing tube 10 of similar length in accordance with the present invention can be produced for $0.03 to $0.04. In respect to tooling costs, tooling for a rigid PVC tube of intricate cross-sectional shape and useful for only one type of connector may run as high as $1,500–$2,500, whereas tooling costs for the packaging tubes 10 of the present invention useful with several different types or shapes of connectors are a fraction thereof.

Referring now to FIGS. 10–14, therein is illustrated a modified form of a new and improved universal packaging tube constructed in accordance with the features of the present invention and referred to generally by the reference number 110. The tube 110 comprises an elongated hollow tubular body 114 preferably formed of extruded resilient, transparent, plastic material adapted to hold and support a plurality of small objects such as electrical components 12, 12A, 12B, 12C, 12D, etc., on ribs 120a and 122a, arranged along a common line or row in a selected orientation with respect to one another as illustrated.

Intermediate its opposite ends, the tube 114 has a generally rectangular or square cross-sectional shape (FIG. 11) including pairs of opposite, spaced apart, essentially flat wall portions 116 and 118, and 120 and 122, respectively, integrally joined together at rounded corner portions 124. When the tubular body 114 is in a generally horizontal position as shown, the lower ends or points 28 of terminal pins of the connectors 12 are supported by ribs 120a and 122a above the inner surface of the bottom wall 118 which supports the components for longitudinal sliding movement along the tubular body. The vertical spacing or interval provided between the opposite inside surfaces of the bottom wall 118 and the top wall 116 is somewhat greater than the distance between the lower end points 28 and the upper ends or points 26 of the upwardly extending terminal pins of the electrical components 12 so as to provide a small amount of clearance or open space 126 between the points 26 and the top wall 116. This clearance permits free longitudinal sliding movement of the connectors 12 along the tubular body 114 between the opposite ends.

Opposite inside surfaces of the side walls 120 and 122 are formed with pairs of integral, parallel, spaced apart, inwardly projecting slide support ribs 120a and 122a, respectively, positioned at a level adjacent a body portion 13 of the connectors 12 between the upper and lower terminal pins thereof. These ribs serve to support and guide the longitudinal movement of the connectors along the tube and maintain the connectors in the proper orientation with respect to the inside surfaces of the tube walls. Opposite inside edges of each pair of opposed ribs 120a and 122a are spaced apart from one another by a horizontal spacing or distance that is somewhat greater than the transverse dimension of the connector body 13 so as to provide an amount of lateral clearance 128 (FIG. 11) between opposite edges of the connector bodies and the adjacent inner edges of the respective ribs 120a and 122a. These lateral clearances 128 permit free longitudinal sliding movement of the connectors 12 along the tube body 114 while the connectors are supported on the slide support ribs 120a and 122a.

The amount of vertical and lateral clearances 126 and 128 for a particular electrical component 12, 12A, etc., and a particular size of a tubular body 114 is selected so as to permit free sliding movement of the connectors along a longitudinal axis of the tube body between the opposite ends but at the same time limit any substantial angular rotation of the components about the longitudinal axis of the tube in a lateral direction relative to the row of components. This arrangement, thus maintains the silhouettes or shapes of successive connectors in the package in the same general angular orientation, so that the tubular body 114 of the package tube 110 can serve as a magazine for use at an assembly station (FIG. 3) or a loading station (FIG. 2) as previously described and depicted herein. The clearances 126 and 128 are chosen to permit a limited amount of angular rotation of the connectors 12 so that longitudinal movement along the tube body 114 in a loading or a dispensing operation is not inhibited.

In accordance with the present invention, each opposite end portion of the elongated tubular body 114 of the package tube 110 is maintained in an essentially open condition and the connectors are retained therein without the use of plugs, inserts, stoppers, etc. This is accomplished by changing the profile or transverse cross-sectional shape at the tube ends in an essentially permanent manner (by heating and deformation when thermosetting plastic resin is used) as shown in FIGS. 10, 11 and 12. At least one pair of opposing walls 116 and 118 or walls 120 and 122 are spaced apart by a smaller distance than a corresponding dimension in the intermediate body portion of the tube between the opposite ends. The reduced spacing between tube walls is made to be less than the corresponding dimension of the particular connectors 12 that are involved.

As illustrated in FIGS. 10 and 12, at the inlet or outlet end of the tube body 114, the opposite side walls 120 and 122 are bowed outwardly and this draws the upper wall 116 and lower wall 118 closer together to an extent that the vertical clearance 126 at the end of the tube is eliminated and the connectors 12 cannot pass in or out. The modified cross-sectional shape at the tube end thus acts as a valve to prevent undesired entry or exit of the connectors into or out of the package. It should be understood that as an alternative, the opposite side walls 120 and 122 can be permanently deformed inwardly at the tube ends to eliminate the horizontal clearance 128 by bowing the top and bottom walls 116 and 118 outwardly away from one another. When the top and bottom walls are bowed outwardly, the opposite sidewalls 120 and 122 are drawn closer together to eliminate the horizontal clearances 128. This arrangement also forms a normally closed valve at the ends of the tube body 114 to prevent the ingress or egress of connectors 12.

In order to open the valve-like end portions of the tube body 114 to insert or dispense the connectors 12 into or out of the tube pack 110, external force is applied to the outside surface of the outwardly bowed side walls 120 and 122 as illustrated in FIG. 13. This external force is applied only at the end of the tube body by pressure members 138 and 140 which act to squeeze (arrows 141) the side walls toward one another and flatten out the permanent bow previously existing and as illustrated in FIGS. 10 and 12. When the side walls 120 and 122 are squeezed toward one another by inward pressure from the members 138 and 140, the tube end temporarily changes in shape or cross-sectional profile back toward the generally rectangular shape or profile of the main body portion (FIG. 11) and the vertical clearance 126 is again established permitting entry or exit of the connectors 12 into or out of the tube package 110 as indicated by the arrow 142 in FIG. 14.

The inward squeezing action by the members 138 and 140 is effective to elevate the top wall 166 above the upper terminal end points 26 and at the same time the bottom wall 118 is flattened out from the configuration of FIG. 12 toward the configuration of FIG. 14. In the latter view, the wall 118 rests upon the upper surface of an elongated tube support base 144 provided between the members 138 and 140 to support the tubular package as a whole while at a loading or unloading station as shown in FIGS. 2 or 3. Whenever the tube package 110 is squeezed by applying pressure on a pair of opposing wall portions at either end, valve opening action as depicted in FIGS. 13 and 14 occurs. When the opposite side walls are flattened somewhat as shown, the horizontal or side clearances 128 between the respective side walls and opposite sides of the connector bodies 13 are diminished to an amount less than that provided in the unstressed tubular body 114 intermediate the ends (FIG. 11). The amount of such diminished clearance is still ample to provide free entry and exit to and from the ends of the tube. At the same time, the vertical clearance 126 is again established to eliminate stopping engagement between the top and bottom tube walls 116 and 118 and the terminal points 26 and 28.

In order to again close the valve to restrict the passageway at the tube ends, the squeezing pressure on the side walls 120 and 122 is relaxed by outward withdrawal (arrows 141) of the pressure members 138 and 140 and when this occurs, the internal tension forces within the material of the tube walls resiliently returns the profile or cross-sectional shape of the tube end to the valve closed shape depicted in FIGS. 10 and 12 for automatically holding and retaining the loaded connectors 12 in the tube body 114.

It should be also understood that the present disclosure has been made only by way of preferred embodiment and that numerous changes in details of construction, combination, and arrangement of parts may be resorted to by those skilled in this art. For example, instead of using movable squeezing pressure members 138 and 140 to deform the end of the package tube 110 for loading or dispensing, the tube may be slid into a holding member provided with a solid shaped orifice which would effectively deform the end of the tube to an open position as the tube is slid into the holding member. All such obvious modifications may be made herein without departing from the true spirit and scope of the invention as hereunder claimed.

What is claimed and sought to be secured by Letters Patent of the United States is:

1. In a package assembly of the type including:
   a plurality of electrical components, each having a similar silhouette around a predetermined axis of the component;
   said components being arrayed in a row with said predetermined axes along a common line and said row having said silhouette;
   a tubular carrier containing said row of electrical components; and
   the improvement comprising:
   said carrier including a unitary, one-piece, continuous peripheral wall of resiliently deformable material defining a hollow interior comprising an elongated component receiving region for containing said row of components therein, said wall having an undeformed first cross-sectional shape intermediate the opposite ends of said carrier capable of freely receiving said silhouette of said components and permitting longitudinal sliding movement of said components toward and away from said ends, and said wall having at least one of said ends formed with a second cross-sectional shape different than said first shape to stoppingly engage an end component in said row and prevent movement thereof into and out of said carrier, said one end being resiliently deformable by external pressure on said wall to alter said second shape toward a third cross-sectional shape for permitting free passage of said components into and out of said carrier, said one end resiliently returning back to said second shape by resilient flexure of said wall material when said external pressure on said wall is reduced.

2. The improvement in a package assembly as defined in claim 1 wherein said carrier is open ended and said wall is formed with a substantially uniform first cross-sectional shape throughout its length between said ends to slideably accommodate said silhouette of said components.

3. The improvement in a package assembly as defined in claim 2 wherein said wall is extruded with said first cross-sectional shape and is modified at the ends to form said second cross-sectional shape to provide valve means for controlling the entry and exit of said components into and out of said carrier.

4. The improvement in a package assembly as defined in claim 3 wherein said first cross-sectional shape is generally polygonal.

5. The improvement in a package assembly as defined in claim 4 wherein said first cross-sectional shape is generally rectangular.

6. The improvement in a package assembly as defined in claim 3 wherein said modified ends of said wall have at least one pair of valve forming opposing wall portions spaced apart by a distance less than that between corresponding wall portions of said carrier having said first cross-sectional shape.

7. In a container for holding a plurality of objects of the type having substantially similar profiles while positioned in serial sequence along a common line within said container;
   the improvement comprising:
   a hollow tube having a wall of flexible material defining a continuous enclosure around said objects positioned along said line;
   said tube having a first cross-sectional shape intermediate its ends for receiving and holding said objects moved into the interior thereof along said line and having a different, second cross-sectional shape at one end forming a stop valve wherein an interior surface of said wall is stoppingly engaged with an object at the end of said line placed therein, said one end being deformable under external pressure to open so as to remove stopping engagement with said object until said external pressure is removed.

8. The improvement of claim 7, wherein:
   said tube is initially formed with an unstressed first cross-sectional shape without interference between said wall and a peripheral portion of said objects present therein permitting longitudinal free sliding movement of said objects in said tube while generally retaining the profiles of said objects in substantially similar alignment along said common line.

9. The improvement of claim 8, wherein:
   said second cross-sectional shape is established at opposite ends of said tube and is modified to form third cross-sectional shape by the application of external force at spaced apart positions on said wall for opening said stop valve.

10. The improvement of claim 9, wherein:
    said tube is formed of resilient flexible material having a memory for resiliently returning from said third cross-sectional shape to said second cross-sectional shape at said ends to again stoppingly engage said object(s) upon relaxation of said external force on said wall.

11. The improvement of claim 10, wherein:
    said tube tends to retain said first cross-sectional shape intermediate said opposite end even though said external force is applied at said ends to open said stop valve by deforming said ends from said second to said third cross-sectional shape for releasing said stopping engagement with said object.

12. In a package for holding a plurality of separate, individual components along a row;
    the improvement comprising:

a plurality of said components having substantially identical shapes and positioned in sequence along said row, each of said components having at least one major dimension measured transversely of said row and a minor dimension angularly disposed to said major dimension, all of said components aligned with said major dimension thereof oriented to extend in substantially the same direction, and an elongated tubular enclosure for holding said plurality of components in said row, said enclosure having a transverse cross-section shaped to surround the extremities of said components to permit free longitudinal sliding movement of said components in said enclosure between opposite ends thereof and having a major transverse axis of said cross-section greater than said major dimension of said components and a minor transverse axis less than said major dimension but greater than said minor dimension of said components whereby said major dimension of said components is maintained to be substantially aligned in said same direction by engagement between an interior surface of said enclosure and opposing extremities of said component on said major dimension; and said tubular enclosure having at least one open end portion formed of deflectable wall material having a maximum transverse dimension between opposing portions of said interior surface on opposite sides of said row that is less than the distance between said opposing extremities of said components until an external force is applied to deflect said wall to increase said maximum dimension until greater than said distance between said opposing extremities for permitting insertion and withdrawal of said components into and out of said enclosure.

13. The improvement of claim 12, wherein:

said wall material has a natural memory tending to return toward a non-deflected condition upon withdrawal of said external force whereby said opposing portions of said interior surface move into stopping engagement with said opposing extremities of said components for holding said components in said enclosure with said major dimension aligned in the same direction.

14. The improvement of claim 13, wherein:

said stopping engagement between said opposing extremities of said components and said opposing portions of said interior surface of said enclosure at said end is maintained by internal tension stress in said wall material.

* * * * *